(12) United States Patent
Shih et al.

(10) Patent No.: US 9,717,163 B2
(45) Date of Patent: Jul. 25, 2017

(54) ELECTRONIC COMPONENT MOUNTING STRUCTURE, MANUFACTURING METHOD AND ELECTRONIC COMPONENT PRODUCT

(71) Applicant: INNOGRATION (SUZHOU) CO., LTD, Jiangsu (CN)

(72) Inventors: Chu Ming Shih, Phoenix, AZ (US); Gordon C. Ma, Suzhou (CN)

(73) Assignee: INNOGRATION (SUZHOU) CO., LTD., Jiangsu (CN)

( * ) Notice: Subject to any disclaimer, the term of this patent is extended or adjusted under 35 U.S.C. 154(b) by 1 day.

(21) Appl. No.: 14/779,916

(22) PCT Filed: Mar. 26, 2014

(86) PCT No.: PCT/CN2014/074099
§ 371 (c)(1),
(2) Date: Sep. 24, 2015

(87) PCT Pub. No.: WO2014/154139
PCT Pub. Date: Oct. 2, 2014

(65) Prior Publication Data
US 2016/0050794 A1 Feb. 18, 2016

(30) Foreign Application Priority Data

Mar. 27, 2013 (CN) .......................... 2013 1 0103741

(51) Int. Cl.
*H05K 7/20* (2006.01)
*H05K 1/02* (2006.01)
(Continued)

(52) U.S. Cl.
CPC ..... *H05K 7/20509* (2013.01); *H01L 23/3677* (2013.01); *H05K 1/0204* (2013.01);
(Continued)

(58) Field of Classification Search
CPC . G06F 1/181–1/182; H05K 7/20218–7/20381;
(Continued)

(56) References Cited

U.S. PATENT DOCUMENTS

| 5,923,531 A * | 7/1999 | Bachman | ........... H05K 7/20718 165/80.3 |
| 2005/0024838 A1* | 2/2005 | Maxwell | ............. H01L 23/5385 361/782 |

(Continued)

FOREIGN PATENT DOCUMENTS

| CN | 1086373 A | 5/1994 |
| CN | 2613046 Y | 4/2004 |

(Continued)

OTHER PUBLICATIONS

International Searching Authority, International Search Report for PCT Application No. PCT/CN22014/074099, mailed Jun. 25, 2014.

*Primary Examiner* — Anthony Haughton
*Assistant Examiner* — Razmeen Gafur
(74) *Attorney, Agent, or Firm* — Honigman Miller Schwartz and Cohn LLP; Matthew H. Szalach; Jonathan P. O'Brien

(57) ABSTRACT

An electronic component mounting structure, manufacturing method and an electronic component product are provided. The electronic component mounting structure comprises a printed circuit board, a metal flange, and a plurality of electronic components provided on the metal flange; a groove is provided on the printed circuit board, a metal layer is coated on a wall of the groove, the metal flange is restricted to the metal layer on the wall and is fixed in the groove, the one or more electronic components are connected to each other through a plurality of wires based on a circuit requirement, an input electrode and an output electrode are provided on the printed circuit board in a portion adjacent to the metal flange, and the input electrode and the (Continued)

output electrode are connected to the one or more electronic components mounted on the metal flange through wires respectively.

20 Claims, 6 Drawing Sheets

(51) Int. Cl.
    *H01L 23/367*      (2006.01)
    *H05K 3/00*      (2006.01)
    *H05K 3/30*      (2006.01)
    *H05K 7/02*      (2006.01)
    *H01L 23/473*      (2006.01)

(52) U.S. Cl.
    CPC ........... *H05K 3/0044* (2013.01); *H05K 3/301* (2013.01); *H05K 7/02* (2013.01); *H01L 2224/48137* (2013.01); *H01L 2224/48227* (2013.01); *H01L 2924/19107* (2013.01); *H05K 2201/0347* (2013.01); *H05K 2201/10416* (2013.01); *H05K 2203/1461* (2013.01)

(58) Field of Classification Search
    CPC ............. H05K 7/20409–7/20418; H05K 7/20009–7/202; H01L 23/367–23/3677; H01L 23/473; H01L 23/46–23/467
    USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236
    See application file for complete search history.

(56) References Cited

U.S. PATENT DOCUMENTS

| | | | | |
|---|---|---|---|---|
| 2005/0057901 A1* | 3/2005 | Obu | ................. | H01L 25/18 361/717 |
| 2006/0120047 A1* | 6/2006 | Inoue | ................. | H01L 23/4006 361/699 |
| 2007/0064396 A1* | 3/2007 | Oman | ................. | H01L 23/427 361/700 |
| 2007/0097622 A1* | 5/2007 | Leech | ................. | G06F 1/20 361/679.54 |
| 2007/0153484 A1* | 7/2007 | Caines | ................. | H05K 5/061 361/707 |
| 2007/0165376 A1* | 7/2007 | Bones | ................. | H01L 25/162 361/688 |
| 2007/0211436 A1* | 9/2007 | Robinson | ............. | H01L 23/552 361/719 |
| 2008/0266808 A1* | 10/2008 | Aberg | ................. | H01L 23/4006 361/709 |
| 2009/0103267 A1* | 4/2009 | Wieland | ............ | H05K 7/20409 361/707 |
| 2009/0185352 A1* | 7/2009 | Ellsworth | ........... | H05K 1/0204 361/720 |
| 2010/0128432 A1* | 5/2010 | Miller | ................. | H05K 7/20836 361/679.54 |
| 2010/0177477 A1* | 7/2010 | Cheng | ................. | G06F 1/20 361/679.47 |
| 2010/0208425 A1* | 8/2010 | Rapisarda | ............ | A41D 27/085 361/692 |
| 2010/0290191 A1* | 11/2010 | Lin | ................. | H01L 23/49816 361/704 |
| 2011/0096507 A1* | 4/2011 | Deram | ................. | H01L 23/3733 361/718 |
| 2011/0156797 A1* | 6/2011 | Ninomiya | ............ | H01L 25/112 327/482 |
| 2011/0176280 A1* | 7/2011 | Lee | ................. | H01L 25/16 361/721 |
| 2012/0063096 A1* | 3/2012 | Kearney | ............ | H01L 23/3107 361/718 |
| 2012/0087097 A1 | 4/2012 | Hong et al. | | |
| 2012/0140403 A1* | 6/2012 | Lau | ................. | H01L 23/427 361/679.47 |
| 2012/0212175 A1* | 8/2012 | Sharaf | ................. | H05K 7/20272 320/107 |
| 2012/0218718 A1* | 8/2012 | Wertz | ................. | H01L 23/4338 361/718 |
| 2012/0236568 A1* | 9/2012 | Lee | ................. | H01L 33/60 362/294 |
| 2012/0314367 A1* | 12/2012 | Zhao | ................. | H01L 23/36 361/695 |

FOREIGN PATENT DOCUMENTS

| | | |
|---|---|---|
| CN | 102448247 A | 5/2012 |
| CN | 202633264 U | 12/2012 |
| CN | 102956605 A | 3/2013 |
| CN | 103237412 A | 8/2013 |
| EP | 0594395 A2 | 4/1994 |
| JP | 2012182345 A | 9/2012 |
| SG | 183652 A1 | 9/2012 |

* cited by examiner

ELECTRONIC COMPONENT MOUNTING STRUCTURE, MANUFACTURING METHOD AND ELECTRONIC COMPONENT PRODUCT

The present application is the national phase of International Application No. PCT/CN2014/074099, titled "ELECTRONIC COMPONENT MOUNTING STRUCTURE, MANUFACTURING METHOD AND ELECTRONIC COMPONENT PRODUCT", filed on Mar. 26, 2014, which claims priority to Chinese Patent Application No. 201310103741.8, titled "ELECTRONIC COMPONENT MOUNTING STRUCTURE, MANUFACTURING METHOD AND ELECTRONIC COMPONENT PRODUCT", filed on Mar. 27, 2013 with the State Intellectual Property Office of People's Republic of China, the disclosures of which are incorporated herein by reference in their entirety.

TECHNICAL FIELD

The disclosure relates to the field of electronic component manufacture, and in particular to an electronic component mounting structure, a manufacturing method thereof and an electronic component product.

BACKGROUND

Usually, an electronic component is surface-mounted or plug-in mounted on a printed circuit board (hereinafter referred to as PCB), e.g., welded to the PCB through a through-hole in the PCB. In this case, heat generated during the operation of the electronic component is transferred to the outside through the air around the electronic component and through the PCB, to achieve heat dissipation for the electronic component. Since heat-conducting capability of PCB and air is poor, this structure is disadvantageous for the electronic component to dissipate heat, and has especially worse heat dissipation effect for high power electronic component. Hence, it is needed to improve the heat dissipation capability of the electronic component through optimization of assembly design for the plug-in mounting component.

One solution is to mount the electronic component with high demand for heat dissipation onto a metal flange, and connect pins of the electronic component to other circuits through wires. Referring to FIG. 1, a diagram of a conventional structure with the electronic component mounted on a PCB is shown. A groove with two open ends is provided on PCB1, a plurality of electronic components 21 are disposed on a metal flange 22 to be accommodated, as a whole, in the groove on PCB1. The plurality of electronic components 21 are connected to each other through wires, with an input terminal and an output terminal being connected to two pads 11 of the PCB respectively, through which the electronic components 21 are connected to an external input/output circuit. In an application, in a case that the electronic components include an active semiconductor component, an electrode corresponding to one of the pads is a gate of the active component, the electrode corresponding to the other of the pads is a drain of the active component, and the metal flange 22 connected to the bottom of the active semiconductor component serves as a source. A piece of metal 3 for heat dissipation is mounted below PCB1, and the piece of metal 3 for heat dissipation contacts with the metal flange 22, so that the heat generated by the electronic components 21 is conducted through the metal flange 22 to the metal 3 for heat dissipation. A protection cover 5 is provided over the periphery of the electronic components 21. In the electronic component mounting structure, the electronic components 21 and the metal flange 22 are manufactured together as a separate component. In the manufacture process, the PCB manufacturer first makes grooves on the PCB and attaches the piece of metal for heat dissipation on the back of the PCB as required. Then, the electronic components (including the metal flange) provided by the electronic component manufacturer are mounted into the groove through reflow process. Finally, a wiring processing is performed, and a package processing is performed over the area of the electronic components. However, there are such problems in the above manufacturing process:

First, the electronic components and the metal flange are formed as a whole, thus the mounting of the electronic components onto the PCB can only be accomplished by means of the weld paste 4 through the reflow process, and the groove on the PCB has to be of the size greater than that of the metal flange. In this way, there are left and right deviations for the position of the metal flange in the groove, and the deviations in the position cause a defect of uneven length of wires between the electronic components on the metal flange and the PCB. The defect results in a severe impedance fluctuation in some high power devices such as high power RF devices, and reduces consistency of the products.

Second, when manufacturing the product, the PCB manufacturer provides the manufactured PCB to the electronic component manufacturer, the electronic component manufacturer mounts the manufactured electronic components into the PCB and then returns the PCB to the PCB manufacturer for the final reflow and wiring processes. The procedure is tedious and inconvenient, which affects the manufacturing period and product cost adversely.

Thus it is necessary to improve the conventional electronic component mounting structure and manufacturing method, in order to solve the technical problem in conventional processes.

SUMMARY

In view of this, the objective of the disclosure is to provide an electronic component mounting structure and a manufacturing method. The electronic component mounting structure can avoid the problem of uneven length of wires caused by position deviation of a metal flange, and thus consistence of electronic component products is improved. In the manufacturing method, intermediate steps in the process of manufacturing the electronic component mounting structure can be saved, production efficiency is enhanced and manufacturing cost is reduced. In addition, the objective of the disclosure is to further provide an electronic component product with the electronic component mounting structure.

An electronic component mounting structure provided based on the objective of the disclosure includes a printed circuit board, a metal flange embedded in the printed circuit board, and one or more electronic components provided on the metal flange, where a groove is provided on the printed circuit board, a metal layer is coated on a wall of the groove, the metal flange is restricted to the metal layer on the wall and is fixed in the groove, the one or more electronic components are connected to each other through a plurality of wires based on a circuit requirement, an input electrode and an output electrode are provided on the printed circuit board in the portion adjacent to the metal flange, and the input electrode and the output electrode are connected to the one or more electronic components mounted on the metal flange through wires respectively.

Optionally, a peripheral circuit is provided on the printed circuit board, and the input electrode and the output electrode are electrically connected to the peripheral circuit.

Optionally, the printed circuit board is a discrete board, with a size meeting a requirement for mounting the metal flange and the one or more electronic components.

Optionally, two electrode pads are provided below the printed circuit board at locations facing the input electrode and the output electrode, respectively, and through-holes filled with metal pillars are provided at the locations in the printed circuit board, so that the two electrode pads are connected to the input electrode and the output electrode on top of the printed circuit board respectively.

Optionally, the electronic component on the metal flange includes one of resistor, inductor, capacitor or any combination thereof, so that the electronic component mounting structure serves as a surface mount device; or the electronic component on the metal flange includes an active semiconductor component, and the metal flange is connected to a source of the active semiconductor component, so that the source of the active semiconductor component is grounded.

Optionally, a protection cover is provided over the printed circuit board in the area adjacent to the metal flange, and covers the one or more electronic components.

Optionally, a thickness of the metal flange is greater than a thickness of the printed circuit board, so that a lower part of the metal flange protrudes beyond the printed circuit board, or the thickness of the metal flange is less than the thickness of the printed circuit board, so that the lower part of the metal flange invaginates into the printed circuit board.

Optionally, material of the metal flange includes one of copper, tungsten copper or cobalt copper.

A method for manufacturing an electronic component mounting structure provided based on the same objective of the disclosure includes:

grooving on the printed circuit board, where a size of the groove is greater than that of the metal flange;

coating a metal layer on the wall of the groove, where a thickness of the metal layer allows the size of an opening of the groove to match with the metal flange;

embedding the metal flange into the groove;

plating metal layers on top and bottom surfaces of the printed circuit board respectively;

patterning the metal layer on the top surface of the printed circuit board through patterning process, to manufacture the input electrode and the output electrode, where the input electrode and the output electrode are located on two sides of the metal flange, and are insulated from the metal flange;

mounting the one or more electronic components on the metal flange;

connecting the respective electronic components through wiring process, and connecting an input terminal and an output terminal of the one or more electronic components to the input electrode and the output electrode located on the printed circuit board; and providing a protection cover over an area where the one or more electronic components are located.

Optionally, the method further includes a step of providing through-holes on two sides of the groove when grooving.

Optionally, the method further includes a step of forming metal pillars in the through-holes when coating the metal layer on the wall of the groove.

Optionally, the method further includes manufacturing two electrode pads below the printed circuit board at locations corresponding to the input electrode and the output electrode in the patterning process, where the two electrode pads are insulated from the metal flange.

An electronic component product provided based on another objective of the disclosure includes the electronic component mounting structure as described above and a metal for heat dissipation, where the metal for heat dissipation is provided below the printed circuit board in the electronic component mounting structure and contacts with the metal flange.

Optionally, a third-party printed circuit board is further provided between the metal for heat dissipation and the electronic component mounting structure, and the input electrode and the output electrode on the printed circuit board in the electronic component mounting structure are both connected to the third-party printed circuit board.

Compared to conventional technology, the electronic component mounting structure of the disclosure has the following technical advantages.

First, in the electronic component mounting structure, the metal flange is directly fixed in the PCB, thus there is no position deviation for the metal flange, and product consistency is improved.

Second, when manufacturing the PCB, the PCB manufacturer already fixes the metal flange in the PCB, thus the electronic component manufacturer may mount the electronic component directly after getting the PCB, intermediate steps are saved, productivity is improved, and cost is lowered.

Third, the electronic component mounting structure according to the disclosure may serve as an intermediate product to be used in combination with an external circuit board, or may be manufactured into an end product such as a surface mount device, a radio frequency device or the like, thus design freedom of the product is greatly enhanced.

Fourth, in a case that the electronic component in the disclosure is a high-frequency device, it is only needed to choose high quality material for the PCB in the electronic component mounting structure while chose ordinary material for the PCB used in other parts. Thus requirements for the material of PCB may be reduced, and cost is further lowered.

BRIEF DESCRIPTION OF THE DRAWINGS

In order to illustrate the technical solutions according to the embodiments of the disclosure or in the conventional technology more clearly, the drawings to be used in the description of the embodiments or the conventional technology are described briefly hereinafter. Apparently, other drawings may be obtained by those skilled in the art according to those drawings without creative effort.

DETAILED DESCRIPTION OF THE EMBODIMENTS

As described in the section of background, in the method for mounting some electronic components for which it is required to consider a heat dissipation issue, an electronic component and a metal flange are manufactured together, and then are mounted onto a PCB. In this method, the electronic component and the metal flange are considered as a separate component which is designed by an electronic component manufacturer, thus the arrangement of the electronic components is less dependent on the PCB to a certain extent, and design freedom for some of the electronic components is improved. However, this method has some deficiencies. In one aspect, when embedding the metal flange into the PCB, there are already electronic components on the surface of the metal flange, thus the weld paste may be only applied to the bottom of the metal flange for a reflow process. Hence it is required that the size of the groove on the PCB is greater than the size of the metal flange. Accordingly, accuracy of position of the metal flange in the groove is hard to be guaranteed, and the electronic component is prone to deviate toward an input terminal or an output terminal, which has severe effects on stability of the product. In another aspect, it is required to manufacture the electronic component and PCB in multi-steps, and intermediate steps are introduced, which cause low productivity and higher manufacturing cost.

Thus, a method for mounting the electronic component is provided in the disclosure. In the method, the metal flange and the PCB are configured as a whole, the metal flange is fixed in the PCB, and then the electronic component is mounted on the metal flange. Thus, the deviation of position of the metal flange in the PCB is avoided, and the consistency of the electronic components is greatly improved. Meanwhile, the process of embedding the metal flange into the PCB may be accomplished by the PCB manufacturer, and the electronic component manufacturer may mount the electronic component on the PCB directly after getting the PCB to form a final product, which reduces intermediate steps, greatly improves productivity, and lowers cost.

Hereinafter, the technical solution of the disclosure is described in connection with specific implementations.

Figure 1:
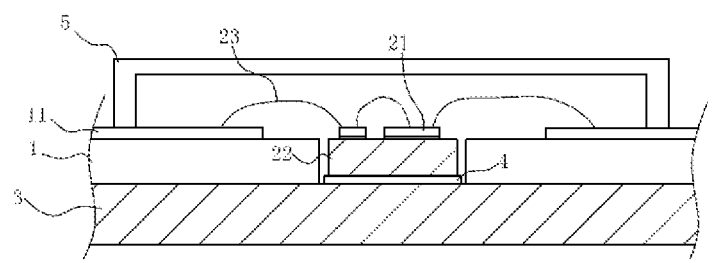
FIG. 1 is a diagram of a conventional structure with an electronic component mounted on a PCB.
Figure 2:
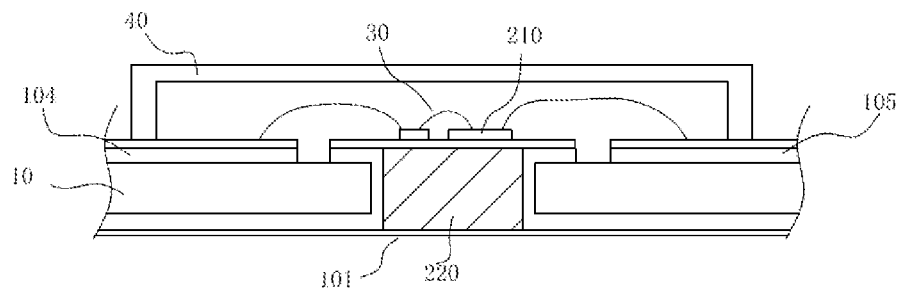
FIG. 2 is a diagram of an electronic component mounting structure according to a first implementation of the disclosure.

Referring to FIG. 2, a diagram of an electronic component mounting structure according to a first implementation of the disclosure is shown. As shown in the figure, a groove 101 is provided on a PCB 10, and a metal flange 220 is embedded in the groove 101. Some electronic components 210 are mounted on the metal flange 220, and the electronic components 210 are connected to each other through wires 30 in accordance with circuit functions, so as to form a circuit with a specific function. In the implementation, peripheral circuit elements (not shown in the drawing) are provided on the PCB 10, and the peripheral circuit elements play a role in connecting, matching or inputting/outputting for the electronic components 210 on the metal flange 220. For example, a signal input circuit is provided among the peripheral circuit elements and provides an input signal to the electronic components 210, and the electronic components 210 process the received signal, such as performing amplifying, filtering and voltage transformation on the signal. Taking another example, a load circuit is provided among the peripheral circuit elements and operates in response to a voltage signal or a current signal provided by the electronic components 210. Alternatively, the peripheral circuit elements are simply a connecting circuit for transmitting the output signal provided by the electronic components 210 to a circuit outside the PCB 10. For any form of peripheral circuit elements, there are at least an input electrode 104 and an output electrode 105 in a portion on the PCB 10 adjacent to the metal flange 220. The input electrode 104 and the output electrode 105 are provided on the same side of the PCB 10 as the electronic components 210 (hereinafter, this side is defined as a top surface of the PCB, and the other side opposite to this side is defined as a bottom surface of the PCB), the input electrode 104 and the output electrode 105 are connected to the electronic components 210 mounted on the metal flange 220 through wires respectively, and meanwhile the input electrode 104 and the output electrode 105 are electrically connected to the peripheral circuit. Generally, it is needed to insulate the two electrodes from the metal flange 220, otherwise short circuit might be caused.

The metal flange 220 is restricted by the metal on two ends of the wall of the groove 101 and is fixed within the groove 101. The metal flange 220 functions to dissipate the heat of the electronic components 210, and also functions to ground in some applications for active components. Material of the metal flange 220 depends on the electronic components 210, e.g., in a case that the power and heat generation of the electronic components 210 are high, metal material with good heat dissipation may be chosen, while in a case that the electronic components 210 are low power components, ordinary metal material may be chosen to save cost. Generally, the material of the metal flange 220 may be copper, tungsten copper, cobalt copper, etc. In the process of manufacture, the opening of the groove 101 may be provided slightly wider, and the size of the groove is adjusted by coating a metal layer on the wall of the groove 101, to allow the size of the opening to match with the metal flange 220, and then the metal flange 220 is embedded into the opening. Further, after being embedded into the groove 101, the metal flange 220 is completely fixed to the PCB 10 via reflow process, to form as a whole. In this way, for the electronic components 210 mounted on the metal flange 220, there is no position deviation, the stability of process is improved, and the manufactured electronic device has high consistency.

The electronic components 210 may be any one of active semiconductor component, passive semiconductor component, and a combination thereof. In a case that the electronic components 210 include the active component, the metal flange 220 is connected to the source of the active component and forms a common source S of the electronic components 210, and in this case the input terminal and the output terminal for the electronic components 210 are connected to the gate G and the drain D respectively while the source S is grounded.

Furthermore, a protection cover 40 is introduced in an area adjacent to the metal flange 220 on the PCB 10, and covers the electronic components 210, thus protects the electronic components 210. Optionally, the protection cover 40 is provided in a detachable structure, thus it is only needed to detach or open the protection cover 40 in case of repairing, changing or adding new electronic component to the electronic components 210 to change the operational function. Hence flexibility of product design is increased, and the electronic component mounting structure according to the disclosure has re-use value. It should be noted that, the protection cover 40 in the disclosure differs from conventional packaging in that air instead of other insulating medium is filled in internal covered space. Air has a relatively low dielectric coefficient, and may reduce parasitic capacitance generated by package medium in some high power components such as radio frequency components.

Figure 3:
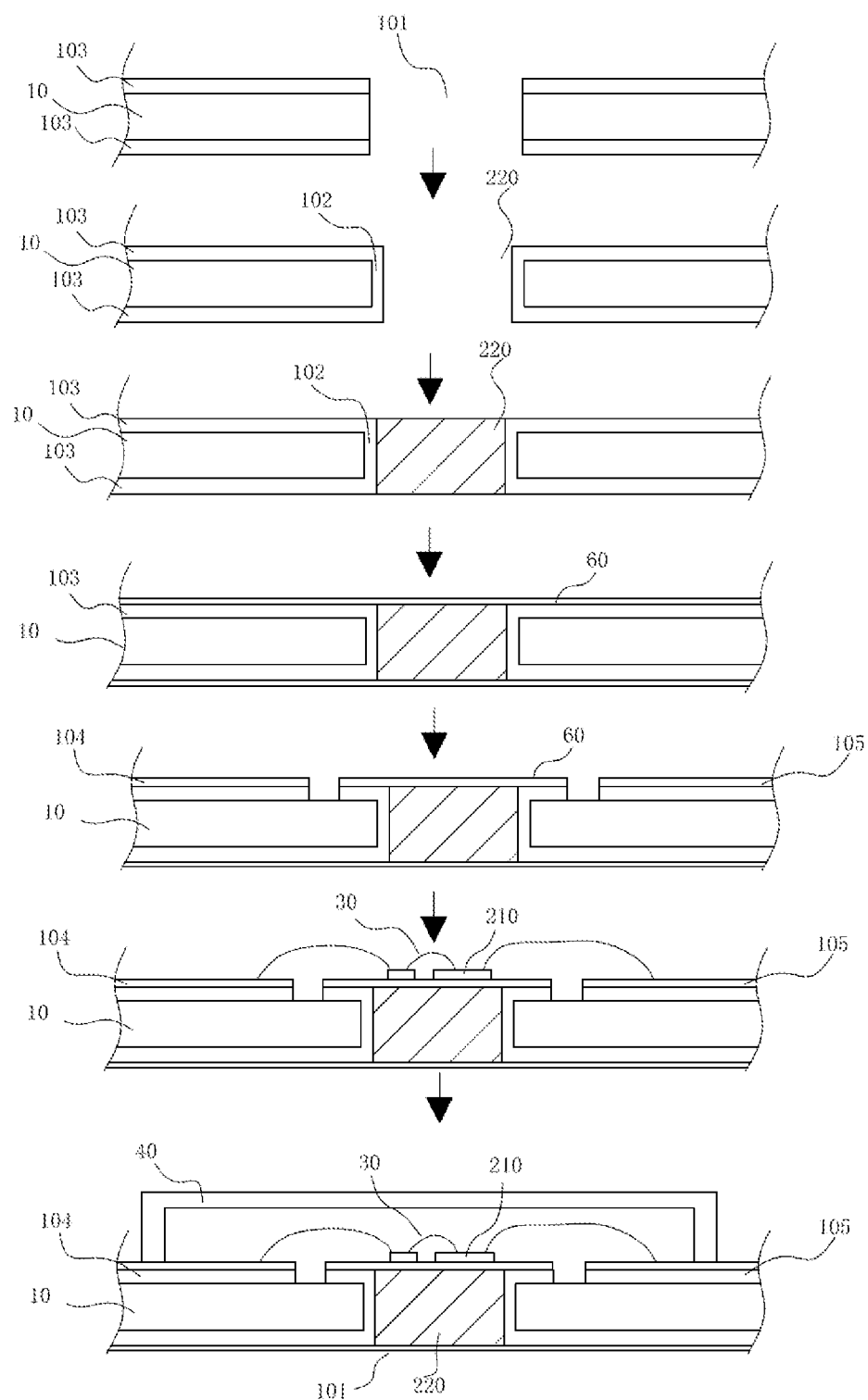
FIG. 3 is a diagram of a manufacturing method for the electronic component mounting structure according to the first implementation of the disclosure.

Referring to FIG. 3, a diagram of a manufacturing method for the electronic component mounting structure according to the first implementation is shown.

As shown in the figure, first, a PCB 10 is provided, and a metal layer 103 is disposed on a surface of the PCB 10. A groove 101 is provided on the PCB 10, and the size of the groove 101 is greater than that of a metal flange. The groove may be formed by mechanical drilling or laser drilling.

Metal is deposited in the groove 101, to allow the wall of the groove 101 to be covered by a layer of metal 102, and the opening size of the groove 101 is precisely controlled through controlling a thickness of the metal 102, so that the opening size of the groove 101 matches with the metal flange.

The metal flange 220 is embedded into the groove 101. Different from that in conventional technology, since the metal flange 220 and the opening of the groove 101 are of approximately the same size, the embedded metal flange 220 may be fixed in the groove 101 tightly without position deviation. Further, after embedding, weld paste is applied at the junction between the metal flange 220 and the groove 101, and the metal flange 220 is completely fixed on the PCB 10 through reflow process, so that the metal flange 220 and the PCB 10 are integrated as a whole.

Then, a plating process is performed on the PCB 10, i.e., a metal layer 60 is plated on top and bottom surfaces of the PCB 10 respectively. The metal layer 60 has the following two functions: first, fixing the metal flange 220 to the PCB 10 more firmly, and second, forming a pad for subsequent wire welding. The manufacture method may be a conventional metal layer manufacture process such as electroplating and evaporation. Usually, the metal layer 60 includes a stack of more than two metal layers, such as nickel plus gold. It should be noted that, the metal layer 60 is very thin, approximately in the order of micrometer, therefore the metal layer 60 may be negligible compared with other material layers.

On a surface of the metal flange 220 to which the electronic components are to be mounted, the metal layer 103 and metal layer 60 on the PCB 10 are patterned to form the patterns of the input/output electrodes 104 and 105 for subsequent use and circuit connecting to the peripheral circuit elements. The input/output electrodes 104 and 105 are located on two sides of the metal flange 220, and are insulated from the metal flange 220.

Electronic components 210 are mounted on the metal flange 220, the electronic components 210 are usually a combination of a plurality of electronic components with specific electrical functions, which may serve as a complete circuit, a module in a circuit, or an electronic element. In consideration of the characteristics of the PCB 10, when mounting the electronic components 210 onto the metal flange 220, the mounting is performed through welding process with temperature below than 250° C., such as silver welding process at low temperature.

After that, the respective electronic components are connected to each other through wires, and the input/output terminals of electronic components are connected to the input/output electrodes 104 and 105 on the PCB 10.

Finally, a protection cover 40 may be added over an area where the electronic components 210 are provided, and the protection cover has functions of collision avoidance, moisture protection, dust prevention, etc., in order to protect the inner electronic components 210 from damage of external environment.

It should be noted that, processes before mounting the electronic component may be accomplished by a PCB manufacturer alone, i.e., the PCB manufacturer may provide a PCB including the metal flange to the electronic component manufacturer, the electronic component manufacturer mounts electronic components on the metal flange directly, and then introduces wires and the cover. Thus, conventional intermediate steps of returning the PCB to the PCB manufacturer for reflow process after mounting the metal flange by the electronic component manufacturer are saved. Production efficiency is improved, manufacture cost is reduced, and a basic platform is provided to the electronic component manufacturer for diversified electronic component design, thus design flexibility of the electronic component manufacturer is greatly enhanced.

Figure 4A:
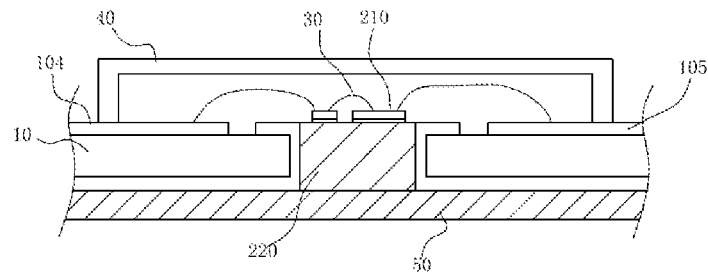
FIGS. 4A and 4B are structure diagrams of an electronic component product manufactured with the electronic component mounting structure according to the first implementation of the disclosure.
Figure 4B:
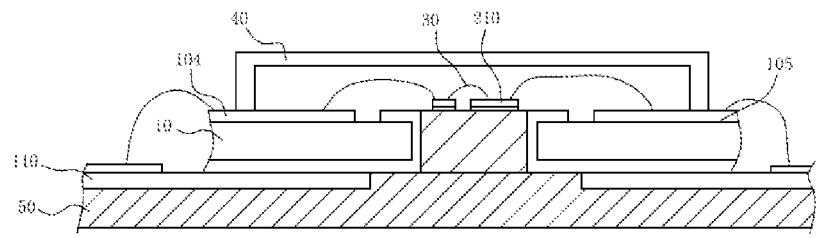

Referring to FIG. 4A-4B, a structure diagram of an electronic component product manufactured based on the electronic component mounting structure according to the first implementation is shown. As shown in the figure, in the first implementation, the PCB 10 has a peripheral device circuit, thus the electronic component mounting structure may serve as a separate electronic component product with a complete circuit function. In this case, it is only needed to mount a piece of metal 50 for heat dissipation. The metal 50 for heat dissipation may fit to the whole PCB 10, or may be only mounted to a heat dissipation area below the metal flange, as shown in FIG. 4A. The electronic component mounting structure may also serve as a functional module in a certain circuit, an in this case, it is needed to mount the PCB 10 onto a third-party PCB 110 with a complete circuit function, connect an input electrode and output electrode on the PCB 10 to the third-party PCB 110 through wires, and groove the third-party PCB 110 and attach the metal 50 for heat dissipation at the location corresponding to the heat dissipation area of the metal flange 220, as shown in FIG. 4B. It should be noted that, the thin metal layer 60 is not illustrated in the structure shown in FIGS. 4A and 4B, however, the metal layer 60 is coated on top and bottom surfaces of the PCB 10, which is the same case in the following drawings.

Figure 5:
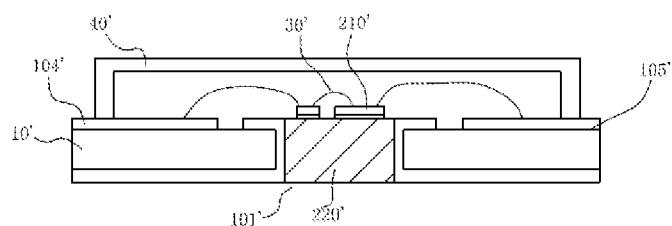
FIG. 5 is a diagram of an electronic component mounting structure according to a second implementation of the disclosure.

Referring to FIG. 5, a diagram of an electronic component mounting structure according to a second implementation is shown. As shown in the figure, a groove 101' is provided on a PCB 10', and a metal flange 220' is embedded in the groove 101'. Some electronic components 210' are mounted on the metal flange 220', and the electronic components 210' are connected to each other through wires 30' based on circuit functions, so as to form a circuit with a specific function. In the implementation, the PCB 10' is a discrete board and only serves as a baseboard for mounting electronic component. No other peripheral circuit is provided on the PCB 10', thus the size of the PCB 10' is designed to just meet mounting requirements of the metal flange and the electronic component. Hence, the electronic component mounting structure in this implementation may be designed as an electronic element with a specific function may be mounted onto an external circuit board when used.

A manufacturing method for electronic component mounting structure in this implementation is fundamentally the same as the manufacturing method for electronic component mounting structure in the first implementation, with the following differences.

Since there is no peripheral circuit on the PCB 10', it is needed to lead out an input electrode 104' and an output electrode 105' in the form of pads, in order to connect to a third-party PCB conveniently. Thus when manufacturing the input electrode 104', the output electrode 105' and a protection cover 40', at least parts of the two electrodes are kept outside, to form connecting pads to the outside. When the electronic component mounting structure is connected to a peripheral PCB, it is only needed to weld wires to the pads to input and output a signal for the electronic components 210'.

Figure 6A:
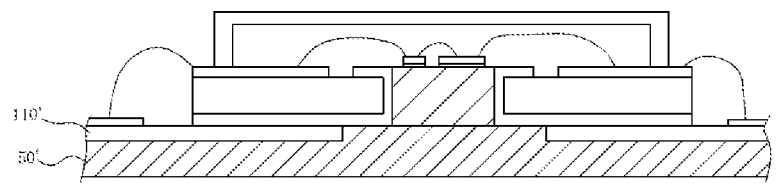
FIGS. 6A and 6B are structure diagrams of an electronic component product manufactured with the electronic component mounting structure according to the second implementation of the disclosure.
Figure 6B:
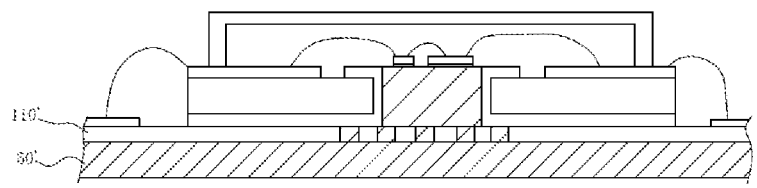

Referring to FIG. 6, a structure diagram of an electronic component product manufactured based on the electronic component mounting structure according to the second implementation of the disclosure is shown. Since the electronic component mounting structure in the implementation is equivalent to an electronic element, in the mounting process, it is needed to mount the electronic component mounting structure onto an external PCB 110' with a complete circuit function, and then connect the pads in the electronic component mounting structure to input/output terminals on the PCB 110'. For some high power components, it is needed to mount a piece of metal 50' for heat dissipation under the PCB 110'. The metal 50' for heat dissipation may contact with the metal flange 220' through forming a groove on the PCB 110', to realize heat dissipation, as shown in FIG. 6A. The metal 50' for heat dissipation may alternatively conduct heat with the metal flange 220' through metal filled in some holes drilled on the PCB 110', to realize heat dissipation, as shown in FIG. 6B. In this implementation, the electronic component mounting structure is similar to an electronic element, thus for applications of some high power products, material of the PCB in the electronic component mounting structure may be chosen as material of high quality, and the material of the third-party PCB may be chosen as ordinary material. Compared to a conventional technology in which it is needed to choose high quality material for the material of the whole PCB, the cost is greatly reduced.

Figure 7:
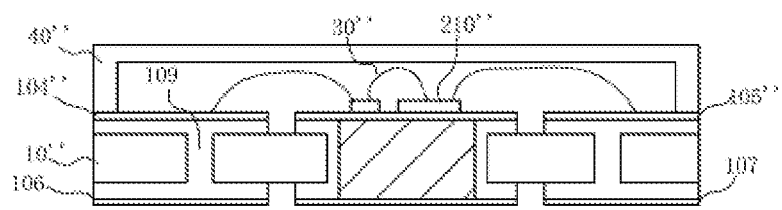
FIG. 7 is a diagram of an electronic component mounting structure according to a third implementation of the disclosure.

Referring to FIG. 7, a diagram of an electronic component mounting structure according to a third implementation is shown. As shown in the figure, a groove 101" is provided on a PCB 10", and a metal flange 220" is embedded in the groove 101". Some electronic components 210" are mounted on the metal flange 220", and the electronic components 210" are connected to each other based on circuit functions through wires 30", so as to form a circuit with a specific function. Compared to the second implementation, two electrode pads 106 and 107 are provided on the bottom of the PCB 10" at locations facing input/output electrodes 104" and 105", and meanwhile a through-hole filled with metal pillar is provided in the PCB 10" at these locations, so that the two electrode pads 106 and 107 are connected to the input/output electrodes 104" and 105" on the top of the PCB 10" respectively. Thus all areas on the top of the PCB 10" are covered by a protection cover 40", to form a sealed structure. The bottom of the PCB 10" becomes the area for electrode pads connecting to an external circuit, and the input electrode, the output electrode together with the grounding electrode correspond to different pads respectively, which makes the electronic component mounting structure more similar to the form of electronic element.

Figure 8:
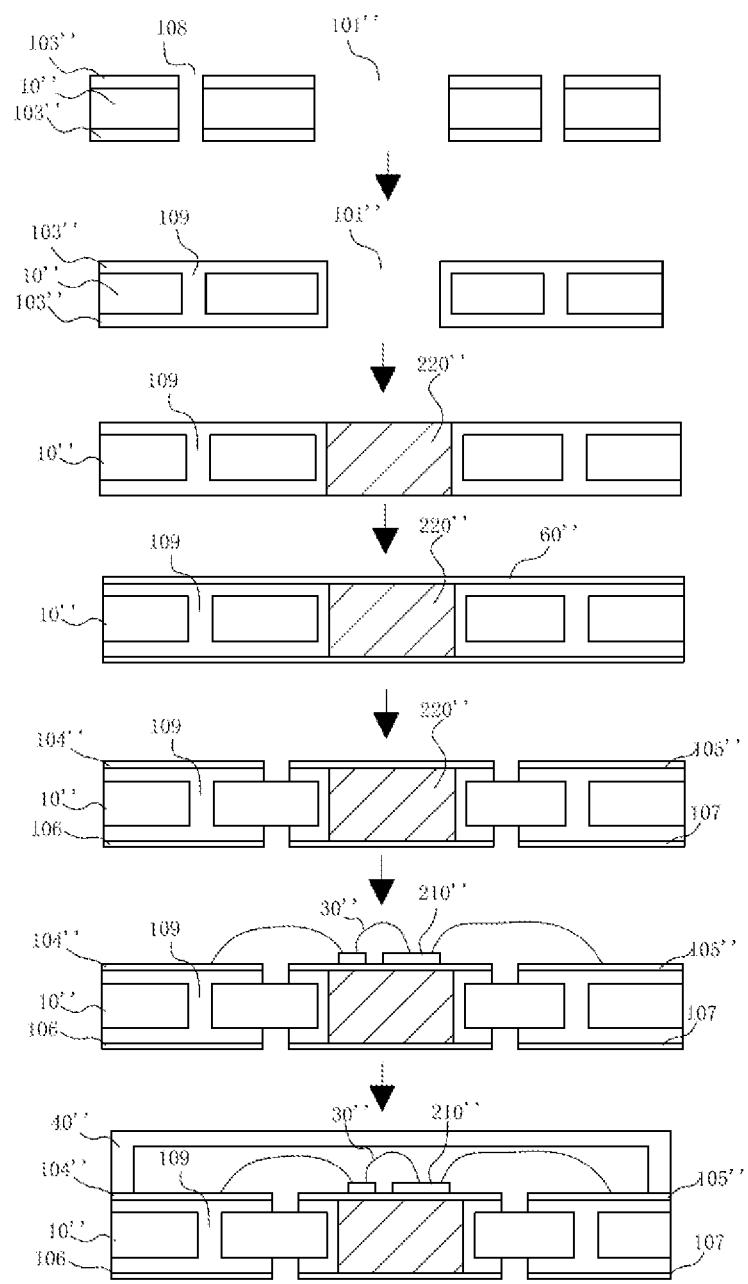
FIG. 8 is a diagram of steps in a manufacturing method for the electronic component mounting structure according to the third implementation of the disclosure.

Referring to FIG. 8, a diagram of steps in a manufacturing method corresponding to the electronic component mounting structure according to the third implementation is shown.

As shown in the figure, first, a PCB 10" is provided, and a metal layer 103" is provided on surface of the PCB 10". A groove 101" and two through-holes 108 on two sides of the groove 101" are provided on the PCB 10", and the size of the groove 101" is greater than that of a metal flange. When grooving, mechanical drilling or laser drilling may be adopted.

The metal is deposited on the groove 101" and the two through-holes 108, to allow wall of the groove 101" to be covered by a layer of metal 102", and allow metal pillars 109 to be formed in the through-holes 108. A size of an opening of the groove 101" is precisely controlled through controlling thickness of the metal 102", so that the size of opening of the groove 101" matches with the metal flange.

The metal flange 220" is embedded into the groove 101". Different from that in conventional technology, since the metal flange 220" and the opening of the groove 101" are of approximately the same size, the embedded metal flange 220" may be fixed in the groove 101" tightly without position deviation. Further, after embedding, weld paste is applied at the junction of the metal flange 220" and the groove 101", and the metal flange 220" is completely fixed on the PCB 10" through reflow process, to allow the metal flange 220" and the PCB 10" to form an integrity.

Then, a plating process is performed on the PCB 10", i.e., a metal layer 60" is plated on top and bottom surfaces of the PCB 10" respectively. The metal layer 60" has the following two functions: first, fixing the metal flange 220" to the PCB 10" more firmly, and second, forming a pad for subsequent wire welding. The manufacture method may be a conventional metal layer manufacture process such as electroplating and evaporation. Usually, the metal layer 60" includes a stack of more than two metal layers, such as nickel plus gold. It should be noted that, the metal layer 60" is very thin, approximately in the order of micrometer, therefore the metal layer 60" may be negligible compared with other material layers.

By means of patterning process, the metal layer 103" and metal layer 60" are patterned, the input/output electrodes 104" and 105" are manufactured on the top of the PCB 10", and electrode pads 106 and 107 are manufactured on the bottom of the PCB 10" at locations corresponding to the input/output electrodes 104" and 105". The input/output electrodes 104" and 105" and the electrode pads 106 and 107 are electrically connected through the corresponding metal pillars 109. The four electrodes are pairwise distributed on two sides of the metal flange 220", and are insulated from the metal flange 220".

Electronic components 210" are mounted on the metal flange 220", the electronic components 210" are usually a combination of a plurality of electronic components with specific electrical functions, which may serve as a complete circuit, a module in a circuit, or an electronic element.

After that, the respective electronic components are connected through wires, and the input/output terminals are connected to the input/output electrodes 104" and 105" on the PCB 10".

Finally, a protection cover 40" may be added over the PCB 10", and the protection cover has functions of collision avoidance, moisture protection, dust prevention, etc., in order to protect the inner electronic components 210" from damage of external environment.

Figure 9:
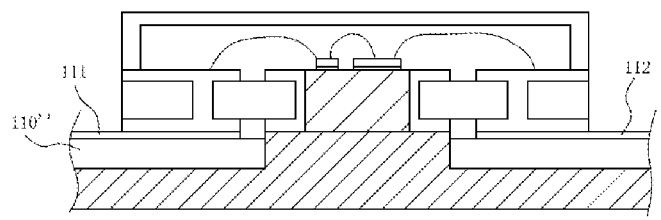
FIG. 9 is a structure diagram of an electronic component product manufactured with the electronic component mounting structure according to the third implementation of the disclosure.

Referring to FIG. 9, a structure diagram of an electronic component product manufactured based on the electronic component mounting structure according to the third implementation of the disclosure is shown. As shown in the figure, in this implementation, all electrode pads of the electronic component mounting structure are provided on the bottom of the PCB 10", thus compared to the second implementation, when mounting the electronic component mounting structure onto a third-party PCB 110", it is only needed to weld the electrode pads to corresponding pads 111 and 112 on the third-party PCB 110" directly, and a process of wiring is saved. Meanwhile, in the practical application of the electronic component mounting structure disclosed in the third implementation, the electronic components 210" on the metal flange 220" are be any one of resistor, inductor or capacitor or any combination thereof, so that the electronic component product forms a surface mount device and may serve as the surface mount device (SMD).

Figure 10:
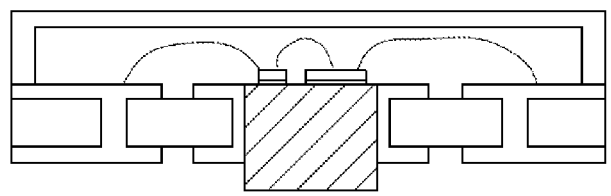
FIG. 10 is a diagram of an electronic component mounting structure according to a fourth implementation of the disclosure.

Referring to FIG. 10, a diagram of an electronic component mounting structure according to a fourth implementation is shown. In this implementation, thickness of a metal flange is greater than the thickness of a PCB, so that a lower part of the metal flange protrudes beyond the PCB. Thus, a metal for heat dissipation may be mounted below the metal flange conveniently. It should be noted that, the thickness of the metal flange may be alternatively chosen to be less than the thickness of the PCB, thus the lower part of the metal flange invaginates in the PCB. In practice, in a case that a plurality of electronic elements are needed, according to spirit of the disclosure, a plurality of metal flanges may be embedded into one piece of PCB and a plurality of electronic components may be provided on the plurality of metal flanges, so as to form a complicated and complete circuit.

In conclusion, an electronic component mounting structure and a manufacturing method thereof are provided in the disclosure. In the electronic component mounting structure, the metal flange is fixed in the groove of the PCB, thus no position deviation occurs, and consistency of products is improved. In addition, when manufacturing the electronic component mounting structure, the PCB manufacturer already fixes the metal flange into the PCB, thus the electronic component manufacturer may mount the electronic component directly after getting the PCB, intermediate steps are saved, production efficiency is improved and cost is reduced.

Based on the electronic component mounting structures according to the embodiments, an electronic component product is further provided according to the embodiment of the disclosure. The electronic component product includes the electronic component mounting structure according to any one of the foregoing embodiments, and further includes a metal for heat dissipation which is provided below a printed circuit board in the electronic component mounting structure and contacts with the metal flange.

Further, a third-party printed circuit board is further provided between the metal for heat dissipation and the electronic component mounting structure, and an input electrode together with an output electrode on the printed circuit board in the electronic component mounting structure are both connected to the third-party printed circuit board.

The electronic component product has same beneficial effects as the electronic component mounting structure.

The forgoing description of the embodiments of the disclosure allows those skilled in the art to implement or use the disclosure. A variety of modifications to the embodiments are apparent for those skilled in the art, and the general principles defined in the disclosure may be implemented in other embodiments without departing from the spirit and scope of the disclosure. Hence, the disclosure is not limited to the embodiments shown in the disclosure, but conforms to a widest scope consistent with the principles and novel features in the disclosure.

What is claimed is:

1. An electronic component mounting structure, comprising a printed circuit board, a metal flange embedded in the printed circuit board, and one or more electronic components provided on the metal flange, wherein a groove is provided on the printed circuit board, a size of the groove is greater than that of the metal flange, a metal layer is coated on a wall of the groove, the metal flange is restricted to the metal layer on the wall and is fixed in the groove, a thickness of the metal layer allows the size of an opening of the groove to match with the metal flange, the one or more electronic components are connected to each other through a plurality of wires based on a circuit requirement, an input electrode and an output electrode are provided on the printed circuit board in a portion adjacent to the metal flange, and the input electrode and the output electrode are connected to the one or more electronic components mounted on the metal flange through wires respectively.

2. The electronic component mounting structure according to claim 1, wherein a peripheral circuit is provided on the printed circuit board, and the input electrode and the output electrode are electrically connected to the peripheral circuit.

3. The electronic component mounting structure according to claim 1, wherein the printed circuit board is a discrete board, with a size meeting a requirement for mounting the metal flange and the one or more electronic components.

4. The electronic component mounting structure according to claim 3, wherein two electrode pads are provided below the printed circuit board at locations facing the input electrode and the output electrode, respectively, and through-holes filled with metal pillars are provided at the locations in the printed circuit board, so that the two electrode pads are connected to the input electrode and the output electrode on top of the printed circuit board respectively.

5. The electronic component mounting structure according to claim 3, wherein the electronic component on the metal flange includes one of resistor, inductor, capacitor or any combination thereof, so that the electronic component mounting structure serves as a surface mount device; or the electronic component on the metal flange includes an active semiconductor component, and the metal flange is connected to a source of the active semiconductor component, so that the source of the active semiconductor component is grounded.

6. The electronic component mounting structure according to claim 1, wherein a protection cover is provided over the printed circuit board in an area adjacent to the metal flange, and covers the one or more electronic components.

7. The electronic component mounting structure according to claim 1, wherein a thickness of the metal flange is greater than a thickness of the printed circuit board, so that a lower part of the metal flange protrudes beyond the printed circuit board, or the thickness of the metal flange is less than the thickness of the printed circuit board, so that the lower part of the metal flange invaginates into the printed circuit board.

8. The electronic component mounting structure according to claim 1, wherein material of the metal flange includes one of copper, tungsten copper or cobalt copper.

9. A method for manufacturing an electronic component mounting structure, wherein the electronic component mounting structure comprises a printed circuit board, a metal flange embedded in the printed circuit board, and one or more electronic components provided on the metal flange, wherein a groove is provided on the printed circuit board, a metal layer is coated on a wall of the groove, the metal flange is restricted to the metal layer on the wall and is fixed in the groove, the one or more electronic components are connected to each other through a plurality of wires based on a circuit requirement, an input electrode and an output electrode are provided on the printed circuit board in a portion adjacent to the metal flange, and the input electrode and the output electrode are connected to the one or more electronic components mounted on the metal flange through wires respectively, the method comprises:
    grooving on the printed circuit board, wherein a size of the groove is greater than that of the metal flange;
    coating a metal layer on the wall of the groove, wherein a thickness of the metal layer allows the size of an opening of the groove to match with the metal flange;
    embedding the metal flange into the groove;
    plating metal layers on top and bottom surfaces of the printed circuit board respectively;
    patterning the metal layer on the top surface of the printed circuit board through patterning process, to manufacture the input electrode and the output electrode, wherein the input electrode and the output electrode are located on two sides of the metal flange, and are insulated from the metal flange;
    mounting the one or more electronic components on the metal flange;
    connecting the respective electronic components through wiring process, and connecting an input terminal and an output terminal of the one or more electronic components to the input electrode and the output electrode located on the printed circuit board; and
    providing a protection cover over an area where the one or more electronic components are located.

10. The method according to claim 9, further comprising a step of providing through-holes on two sides of the groove when grooving.

11. The method according to claim 10, further comprising a step of forming metal pillars in the through-holes when coating the metal layer on the wall of the groove.

12. The method according to claim 11, further comprising manufacturing two electrode pads below the printed circuit board at locations corresponding to the input electrode and the output electrode in the patterning process, wherein the two electrode pads are insulated from the metal flange.

13. An electronic component product, comprising an electronic component mounting structure and a metal for heat dissipation, wherein the electronic component mounting structure comprises a printed circuit board, a metal flange embedded in the printed circuit board, and one or more electronic components provided on the metal flange, a groove is provided on the printed circuit board, a size of the groove is greater than that of the metal flange, a metal layer is coated on a wall of the groove, a thickness of the metal layer allows the size of an opening of the groove to match with the metal flange, the metal flange is restricted to the metal layer on the wall and is fixed in the groove, the one or more electronic components are connected to each other through a plurality of wires based on a circuit requirement, an input electrode and an output electrode are provided on the printed circuit board in a portion adjacent to the metal flange, and the input electrode and the output electrode are connected to the one or more electronic components mounted on the metal flange through wires respectively, the metal for heat dissipation is provided below the printed circuit board in the electronic component mounting structure and contacts with the metal flange.

14. The electronic component product according to claim 13, wherein a third-party printed circuit board is further provided between the metal for heat dissipation and the electronic component mounting structure, and the input electrode and the output electrode on the printed circuit board in the electronic component mounting structure are both connected to the third-party printed circuit board.

15. The electronic component product according to claim 13, wherein a peripheral circuit is provided on the printed circuit board, and the input electrode and the output electrode are electrically connected to the peripheral circuit.

16. The electronic component product according to claim 13, wherein the printed circuit board is a discrete board, with a size meeting a requirement for mounting the metal flange and the one or more electronic components.

17. The electronic component product according to claim 16, wherein two electrode pads are provided below the printed circuit board at locations facing the input electrode and the output electrode, respectively, and through-holes filled with metal pillars are provided at the locations in the printed circuit board, so that the two electrode pads are connected to the input electrode and the output electrode on top of the printed circuit board respectively.

18. The electronic component product according to claim 16, wherein the electronic component on the metal flange includes one of resistor, inductor, capacitor or any combination thereof, so that the electronic component mounting structure serves as a surface mount device; or the electronic component on the metal flange includes an active semiconductor component, and the metal flange is connected to a source of the active semiconductor component, so that the source of the active semiconductor component is grounded.

19. The electronic component product according to claim 13, wherein a protection cover is provided over the printed circuit board in an area adjacent to the metal flange, and covers the one or more electronic components.

20. The electronic component product according to claim 13, wherein a thickness of the metal flange is greater than a thickness of the printed circuit board, so that a lower part of the metal flange protrudes beyond the printed circuit board, or the thickness of the metal flange is less than the thickness of the printed circuit board, so that the lower part of the metal flange invaginates into the printed circuit board.

* * * * *